(12) United States Patent
Hsieh

(10) Patent No.: US 10,062,664 B2
(45) Date of Patent: Aug. 28, 2018

(54) SEMICONDUCTOR PACKAGING DEVICE WITH HEAT SINK

(71) Applicant: TAIWAN SEMICONDUCTOR MANUFACTURING COMPANY LTD., Hsinchu (TW)

(72) Inventor: Cheng-Chieh Hsieh, Tainan (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 15/356,440

(22) Filed: Nov. 18, 2016

(65) Prior Publication Data

US 2018/0005985 A1    Jan. 4, 2018

Related U.S. Application Data

(60) Provisional application No. 62/356,998, filed on Jun. 30, 2016.

(51) Int. Cl.
| | |
|---|---|
| *H01L 23/10* | (2006.01) |
| *H01L 23/34* | (2006.01) |
| *H01L 25/065* | (2006.01) |
| *H01L 23/367* | (2006.01) |
| *H01L 23/427* | (2006.01) |

(52) U.S. Cl.
CPC ...... *H01L 25/0655* (2013.01); *H01L 23/3675* (2013.01); *H01L 23/427* (2013.01)

(58) Field of Classification Search
CPC ..... H01L 2924/351; H01L 2924/16152; H01L 2225/06589; H01L 33/648; H01L 23/373; H01L 25/0655
USPC ................. 257/706, 707, 713, 714
See application file for complete search history.

(56) References Cited

U.S. PATENT DOCUMENTS

| | | | | |
|---|---|---|---|---|
| 4,833,567 A * | 5/1989 | Saaski | ............... | F28D 15/0233 165/104.26 |
| 6,507,098 B1 * | 1/2003 | Lo | ............... | H01L 25/0652 257/686 |
| 7,031,162 B2 * | 4/2006 | Arvelo | ............... | H01L 23/3675 257/707 |
| 8,558,372 B2 * | 10/2013 | Negoro | ............... | H01L 23/13 257/706 |

* cited by examiner

*Primary Examiner* — S. V. Clark
(74) *Attorney, Agent, or Firm* — WPAT, P.C., Intellectual Property Attorneys; Anthony King

(57) ABSTRACT

A semiconductor packaging device includes: a first chip disposed separately from the first chip on a substrate; a second chip disposed on the substrate, wherein the first chip and the second chip comprise a first heat energy producing rating and a second heat energy producing rating, respectively, the first heat energy producing rating is different from the second heat energy producing rating; and a heat sink arranged in thermal communication with the first chip and the second chip, wherein the heat sink is arranged to have a first slot configured substantially along a separation region between the first chip and the second chip.

18 Claims, 14 Drawing Sheets

SEMICONDUCTOR PACKAGING DEVICE WITH HEAT SINK

CROSS-REFERENCE TO RELATED APPLICATION

This application claims the benefit of U.S. Provisional Application No. 62/356,998, filed Jun. 30, 2016.

BACKGROUND

To reduce the overall size of an electronic device, a multi-chip module is applied. In the multi-chip module, a plurality of chips are mounted to a single substrate. Accordingly, the heat removal of the package of these chips becomes increasingly important to assure the proper operation. Using a common heat sink to dissipate heat generated from these chips is well known. However, during the operation, the chips may produce different heat. For some extreme cases, the heat difference between two chips can be as high as 10 times or above. Consequently, a heat sink with large cooling capability, which may be greater than the required cooling capability, is adopted to maintain good heat dissipation from all the chips. In addition, the thermal interference between or among the chips can be severe when the common heat sink is applied.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
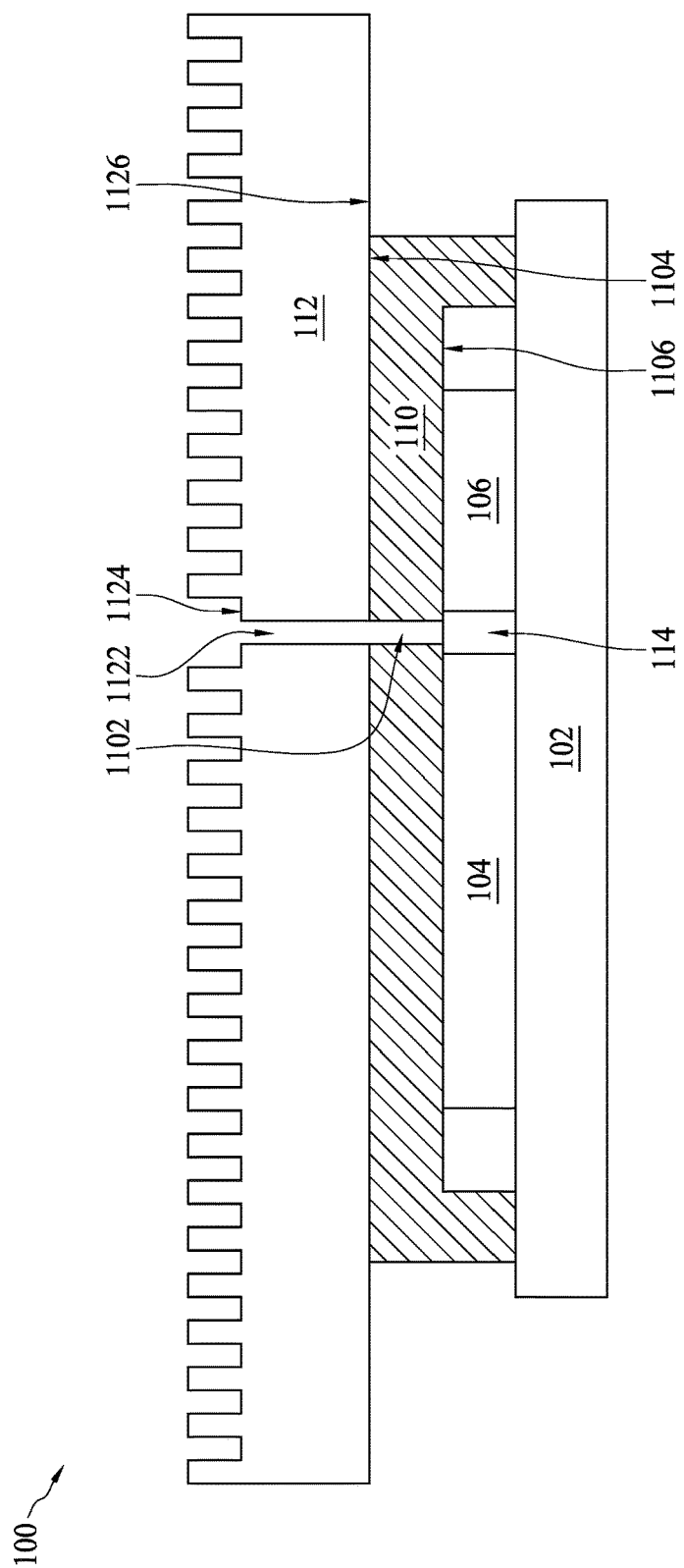
FIG. 1 is a diagram illustrating a cross sectional view of a semiconductor packaging device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper", "lower", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Figure 2:
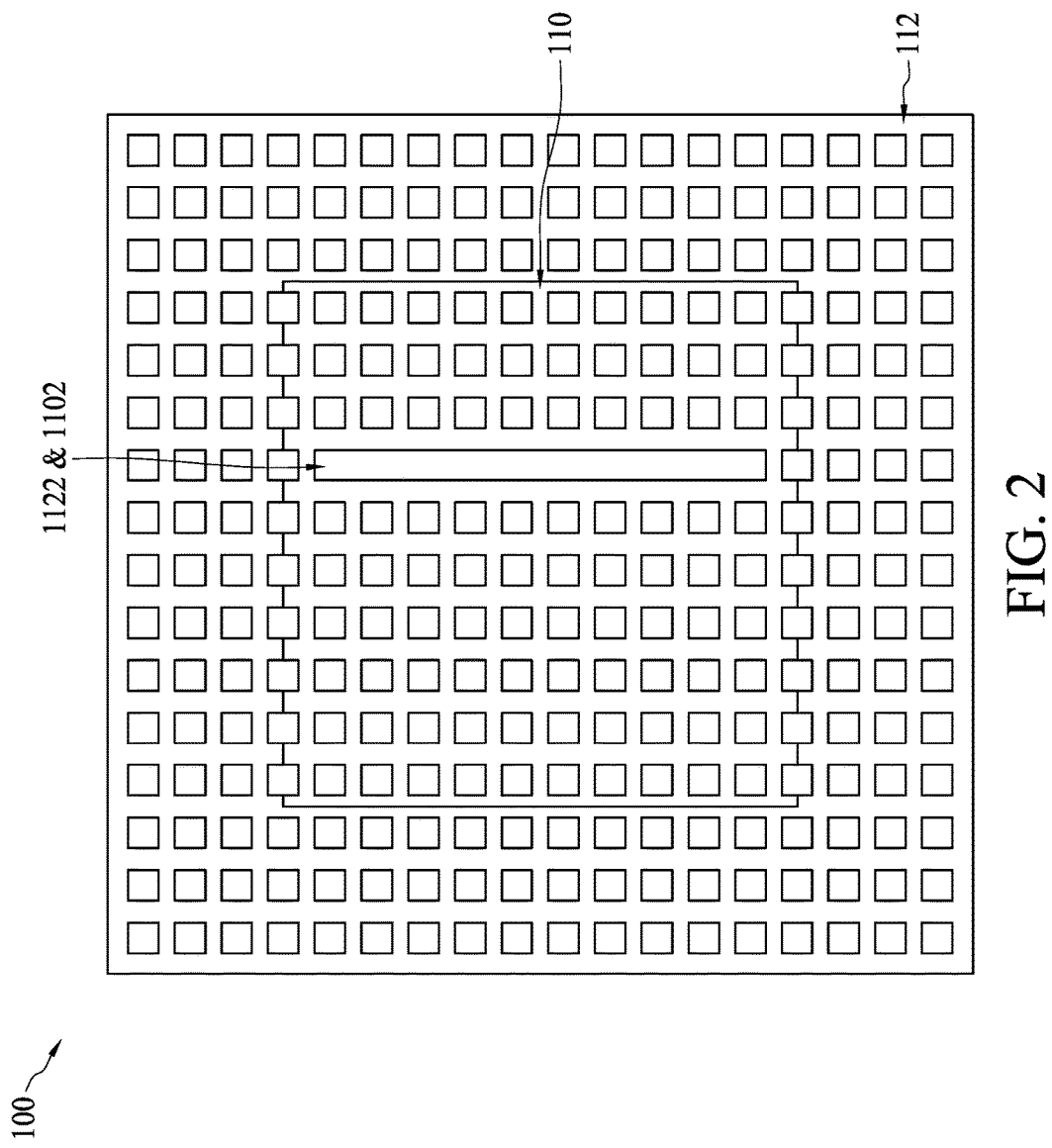
FIG. 2 is a diagram illustrating a top view of the semiconductor packaging device of FIG. 1 in accordance with some embodiments.
Figure 3:
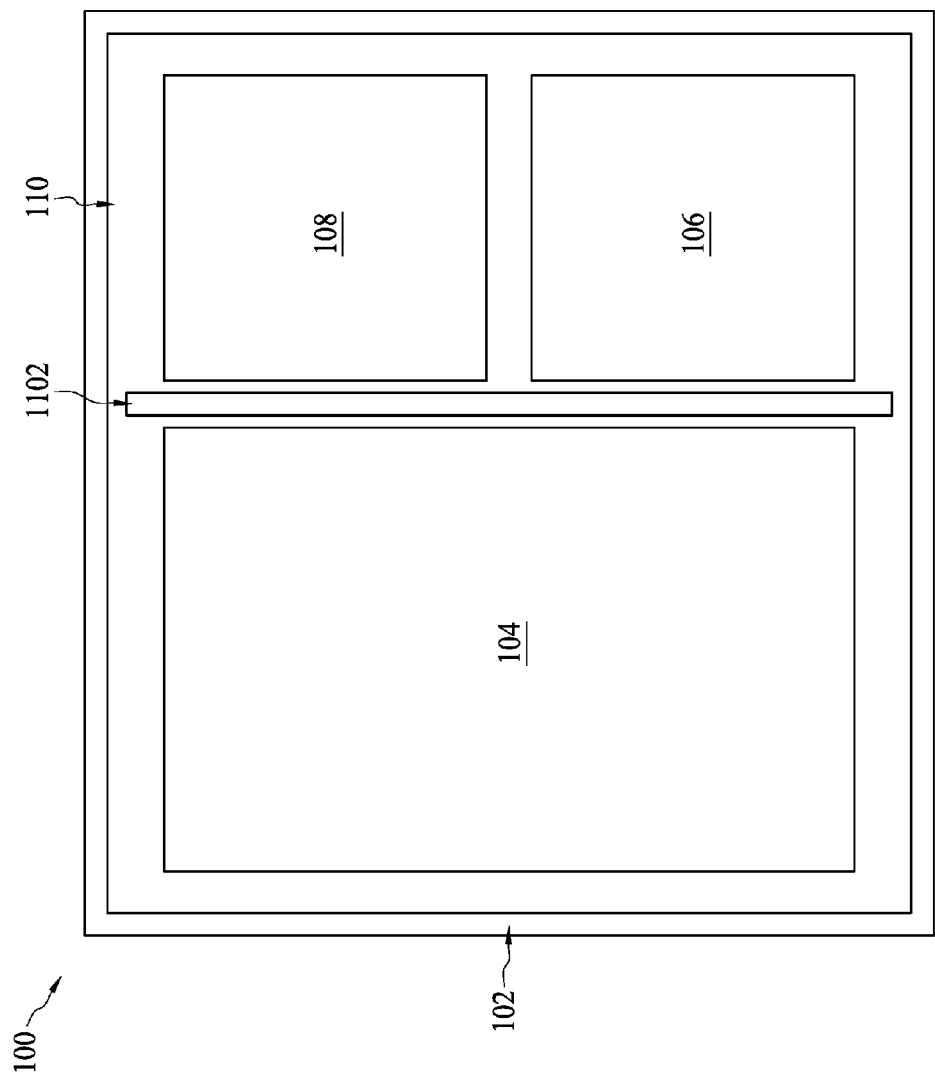
FIG. 3 is another diagram illustrating the top view of the semiconductor packaging device of FIG. 1 without the heat sink in accordance with some embodiments.

FIG. 1 is a diagram illustrating a cross sectional view of a semiconductor packaging device 100 in accordance with some embodiments. FIG. 2 is a diagram illustrating a top view of the semiconductor packaging device 100 in accordance with some embodiments. The semiconductor packaging device 100 comprises a substrate 102, a first chip 104, a second chip 106, a third chip 108, a lid 110, and a heat sink 112. The first chip 104, the second chip 106, and the third chip 108 are disposed separately from each other on the substrate 102. The first chip 104, the second chip 106, and the third chip 108 may be integrated circuits or semiconductor dies. The lid 110 is disposed on the first chip 104, the second chip 106, and the third chip 108. The heat sink 112 is disposed on the lid 110. Therefore, the heat sink 112 is in thermal communication with the first chip 104, the second chip 106, and the third chip 108. The heat sink 112 is arranged to dissipate heat produced by the first chip 104, the second chip 106, and the third chip 108. For illustration purpose, FIG. 3 is another diagram illustrating the top view of the semiconductor packaging device 100 without the heat sink 112 in accordance with some embodiments. The material of the heat sink 112 may be composed by copper, aluminum, or the alloy of these metals. The material of the heat sink 112 may be composed by copper and/or aluminum. The material of the lid 110 may be composed by copper, aluminum, and/or silicon carbide (SiC).

According to some embodiments, the first chip 104, the second chip 106, and the third chip 108 comprise a first heat energy producing rating, a second heat energy producing rating, and a third heat energy producing rating respectively during the normal operation. During the normal operation, the first chip 104, the second chip 106, and the third chip 108 perform the predetermined functions respectively. For example, the second heat energy producing rating may substantially equal to the third heat energy producing rating, and the first heat energy producing rating may greater than the second heat energy producing rating and the third heat energy producing rating. In other words, the first chip 104 needs to have a greater heat dissipation capability than the second chip 106 and the third chip 108. According to some embodiments, the heat sink 112 is arranged to have a slot 1122, and the slot 1122 is positioned on or above the interspace 114 among the first chip 104, the second chip 106, and the third chip 108. Specifically, the slot 1122 is configured substantially along a separation region among the first chip 104, the second chip 106, and the third chip 108. The slot 1122 is arranged to penetrate the heat sink 112. In other words, the slot 1122 passes from the top surface 1124 to the bottom surface 1126 of the heat sink 112. According to some embodiments, the first chip 104 is mounted on the left side of the substrate 102, and the second chip 106 and the third chip 108 are mounted on the right side of the substrate 102. Therefore, the slot 1122 is a rectangle slot to physically separate the first chip 104 from the second chip 106 and the third chip 108 viewing from the top as shown in FIG. 2. In this embodiment, the slot 1122 does not physically divide the heat sink 112 into two separated portions. Instead, the heat sink 112 is a one-piece device. However, this is not a limitation of the present embodiment. The slot 1122 may physically divide the heat sink 112 into two or more separated portions, which also belongs to the scope of the present invention.

In addition, the lid 110 is also arranged to have a slot 1102. According to some embodiments, the slot 1102 is aligned with the slot 1122 of the heat sink 112. In other words, the slot 1102 is also positioned above the interspace 114 among the first chip 104, the second chip 106, and the third chip 108. The slot 1102 is arranged to penetrate the lid 110. In other words, the slot 1102 passes from the top surface 1104 to the bottom surface 1106 of the lid 110. In this embodiment, the slot 1102 does not physically divide the lid 110 into two separated portions as shown in FIG. 3. Instead, the lid 110 is a one-piece device. However, this is not a limitation of the present embodiment. The slot 1102 may physically divide the lid 110 into two or more separated portions, which also belongs to the scope of the present invention.

Accordingly, when the heat sink 112 is disposed on the lid 110, the portion corresponding to the interspace 114 among the first chip 104, the second chip 106, and the third chip 108 is exposed to the external environment of the semiconductor packaging device 100. According to some embodiments, the interspace 114 among the first chip 104, the second chip 106, and the third chip 108 is disposed with a polymer layer. Therefore, the top surface of the polymer layer is exposed to the external environment of the semiconductor packaging device 100 via the slot 1102 and the slot 1122. However, this is not a limitation of the present invention. In another embodiment, the interspace 114 among the first chip 104, the second chip 106, and the third chip 108 is an empty space. When the lid 110 and the heat sink 112 are disposed on the first chip 104, the second chip 106, and the third chip 108, the top surface of the substrate 102 corresponding to the interspace 114 is exposed to the external environment of the semiconductor packaging device 100 via the slot 1102 and the slot 1122.

When the heat sink 112 as well as the lid 110 is designed to have the slot 1102 above the interspace 114 among the first chip 104, the second chip 106, and the third chip 108, the thermal energy of the first chip 104 may not affect the second chip 106 and the third chip 108 when the first heat energy producing rating is greater than the second heat energy producing rating and the third heat energy producing rating. According to some embodiments, the thermal energy of the first chip 104 is blocked or isolated by the slot 1102 and the slot 1122. The thermal energy of the first chip 104 does not transfer straight to the second chip 106 and the third chip 108 via the heat sink 112. In other words, the slot 1102 and the slot 1122 are designed for isolating or limiting the heat of the first chip 104 from transferring to the second chip 106 and the third chip 108 via the heat sink 112. Therefore, the heat sink 112 is an adaptive heat sink capable of alleviating thermal interference between or among the first chip 104, the second chip 106, and the third chip 108.

Figure 4:
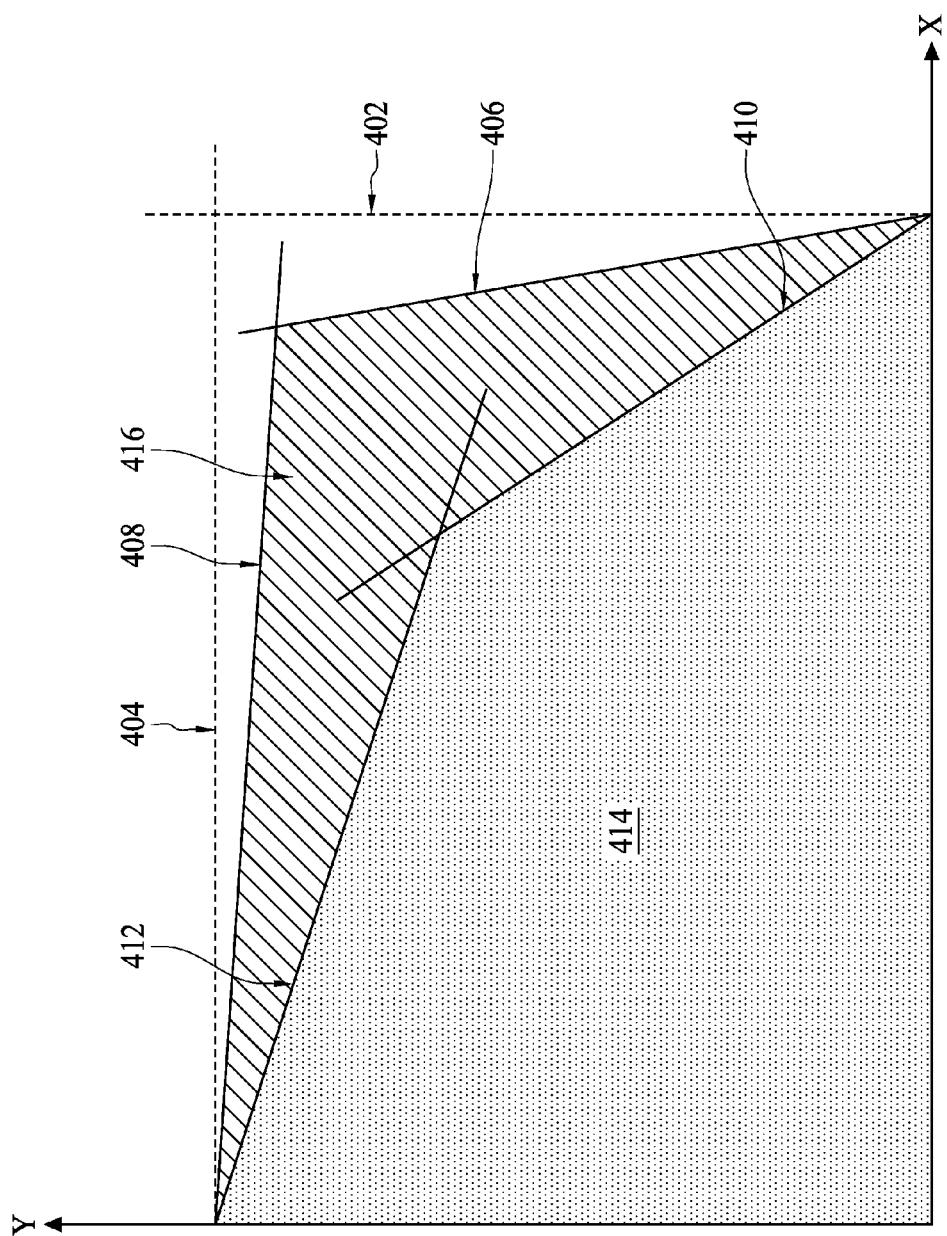
FIG. 4 is a diagram illustrating the relationship between the first heat energy of a first chip and a total of a second heat energy and a third heat energy of a second chip and a third chip of FIG. 1 in accordance with some embodiments.

FIG. 4 is a diagram illustrating the relationship between the first heat energy producing rating of the first chip 104 and a total of the second heat energy producing rating and the third heat energy producing rating of the second chip 106 and the third chip 108 in accordance with some embodiments. X-axis represents the total of the second heat energy producing rating and the third heat energy producing rating.

Y-axis represents the first heat energy producing rating. The dashed line 402 is the maximum total heat energy producing rating of the second chip 106 and the third chip 108 that can be dissipated by the heat sink 112 with the slot 1122 when the first chip is disabled or turned off. The dashed line 404 is the maximum heat energy producing rating of the first chip 104 that can be dissipated by the heat sink 112 with the slot 1122 when the second chip 106 and the third chip 108 are disabled. The line 406 is the maximum total heat energy producing rating of the second chip 106 and the third chip 108 that can be dissipated by the heat sink 112 with the slot 1122 when the first chip 104 is enabled or turned on. The line 408 is the maximum heat energy producing rating of the first chip 104 that can be dissipated by the heat sink 112 with the slot 1122 when the second chip 106 and the third chip 108 are enabled. The line 310 is the maximum total heat energy producing rating of the second chip 106 and the third chip 108 that can be dissipated by the heat sink 112 without the slot 1122 when the first chip is enabled. The line 312 is the maximum heat energy producing rating of the first chip 104 that can be dissipated by the heat sink 112 without the slot 1122 when the second chip 106 and the third chip 108 are enabled.

The area 414 surrounded by X-axis, Y-axis, the line 410, and the line 412 is thermally operable region of the heat sink 112 without the slot 1122. The area 416 surrounded by X-axis, Y-axis, the line 406, and the line 408 is thermally operable region of the heat sink 112 with the slot 1122. In comparison to the heat sink 112 without the slot 1122, an extra operable space, which is surrounded by the line 410, the line 412, the line 406, and the line 408, is gained by the heat sink 112 with the slot 1122. Accordingly, when first chip 104, the second chip 106, and the third chip 108 are enabled, the total heat energy producing rating that can be dissipated by the heat sink 112 is increased.

According to the above embodiments, the performance of thermal dissipation of the semiconductor packaging device 100 is greatly improved by adaptively designing the slot 1122 and the slot 1102 on the heat sink 112 and the lid 110 respectively. The present heat sink is easy to be implemented, and thus the present heat sink is the relatively low cost heat sink for improving the thermal dissipation capability of multi-chip packages. The present heat sink is also compatible with the existing thermal solution supply chain. Moreover, the present heat sink is tolerant to different chip stack-up heights.

According to FIG. 1 and FIG. 2, the heat dissipation of the first chip 104, the second chip 106, and the third chip 108 in the semiconductor packaging device 100 is performed by the heat sink 112. However, this is not a limitation of the present invention. The heat dissipation of the first chip 104, the second chip 106, and the third chip 108 in the semiconductor packaging device 100 may be performed by a heat sink in conjunction with a heat pipe.

Figure 5:
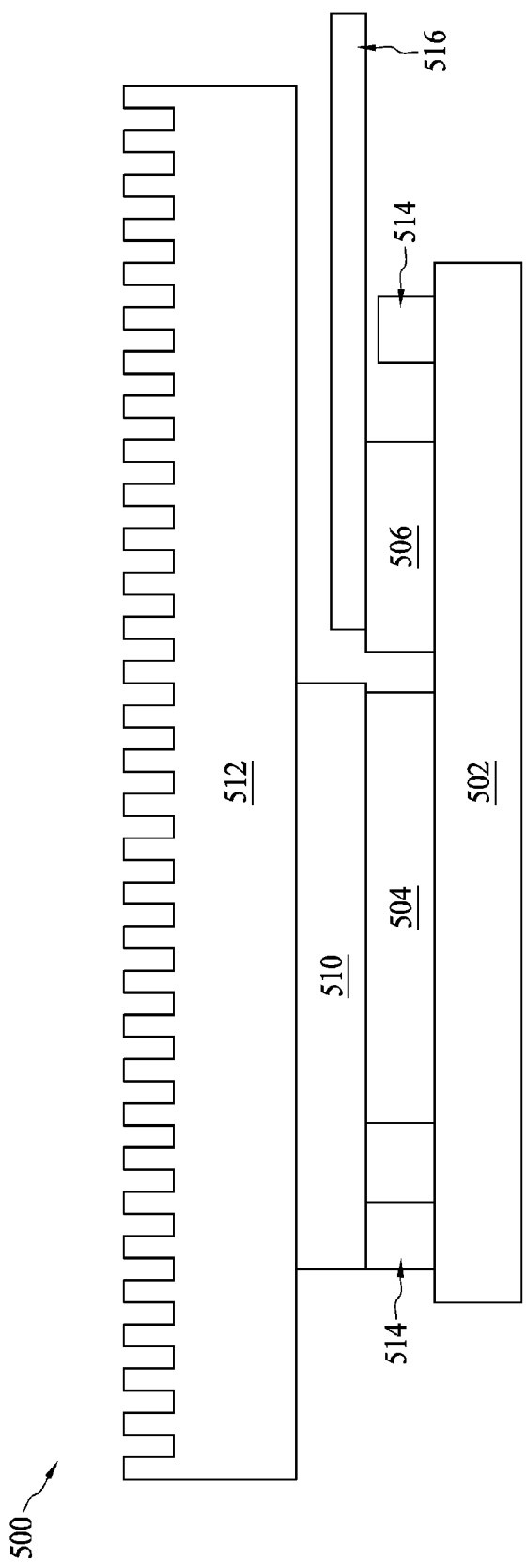
FIG. 5 is a diagram illustrating a cross sectional view of a semiconductor packaging device in accordance with some embodiments.
Figure 6:
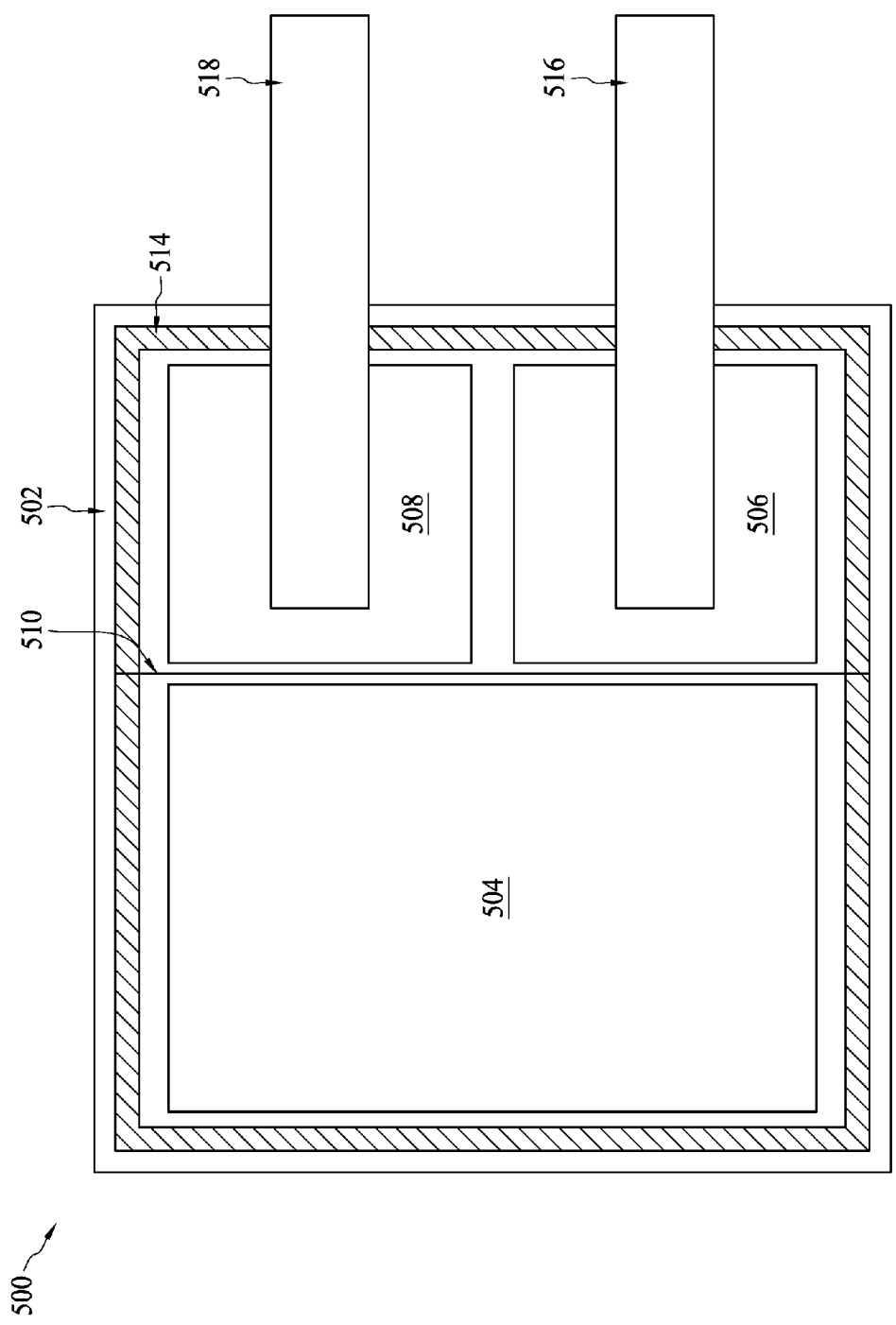
FIG. 6 is a diagram illustrating a top view of the semiconductor packaging device of FIG. 5 in accordance with some embodiments.

FIG. 5 is a diagram illustrating a cross sectional view of a semiconductor packaging device 500 in accordance with some embodiments. FIG. 6 is a diagram illustrating a top view of the semiconductor packaging device 500 in accordance with some embodiments. The semiconductor packaging device 500 comprises a substrate 502, a first chip 504, a second chip 506, a third chip 508, a lid 510, a heat sink 512, a ring 514, a first heat pipe 516, and a second heat pipe 518. For brevity, the heat sink 512 is omitted in FIG. 6. The first chip 504, the second chip 506, and the third chip 508 are disposed separately from each other on the substrate 502. The ring 514 is arranged to surround the first chip 504, the second chip 506, and the third chip 508. The lid 510 is disposed on the first chip 504. The heat sink 512 is disposed on the lid 510. Specifically, the heat sink 512 is disposed in thermal communication with the first chip 504. The heat sink 512 is arranged at least partially over the second chip 506 and the third chip 508. The first chip 504, the second chip 506, and the third chip 508 comprise a first heat energy producing rating, a second heat energy producing rating, and a third heat energy producing rating respectively. The heat sink 512 comprises a first heat energy dissipation rating corresponding to the first heat energy producing rating for dissipating heat energy generated by the first chip 504. The first heat pipe 516 and the second heat pipe 518 are disposed or directly attached on the second chip 506 and the third chip 508 respectively. The first heat pipe 516 and the second heat pipe 518 are at least partially under a planar projection of the heat sink 512. The first heat pipe 516 comprises a second heat energy dissipation rating corresponding to the second heat energy producing rating for dissipating heat energy generated by the second chip 506. The second heat pipe 518 comprises a third heat energy dissipation rating corresponding to the third heat energy producing rating for dissipating heat energy generated by the third chip 508. The first heat pipe 516 and the second heat pipe 518 are disposed between the heat sink 512 and the substrate 502 viewing from the cross sectional structure, and the first heat pipe 516 and the second heat pipe 518 are physically separated from the heat sink 512. Moreover, the first heat pipe 516 has a first end directly attached to the second chip 506 and a second end extended beyond the heat sink 512. The second heat pipe 518 has a first end directly attached to the third chip 508 and a second end extended beyond the heat sink 512. The heat sink 512 is a one-piece device without a slot, and the size of the heat sink 512 is larger than the size of the substrate 502 as shown in FIG. 5. The material of the heat sink 512 may be composed by copper and/or aluminum. The material of the lid 510 may be composed by copper, aluminum, and/or silicon carbide (SiC). The material of the ring 514 may be composed by copper and/or aluminum. The material of the heat pipe 516 may be composed by copper and/or aluminum.

According to some embodiments, the second heat energy producing rating may equal to the third heat energy producing rating, and the first heat energy producing rating may greater than the second heat energy producing rating and the third heat energy producing rating. In other words, the first chip 504 needs to have a greater heat dissipation capability than the second chip 506 and the third chip 508. According to some embodiments, the heat sink 512 has greater heat dissipation capability than the first heat pipe 516 and the second heat pipe 518.

In addition, when the first heat energy of the first chip 504 is dissipated by the heat sink 512 which is physically separated from the first heat pipe 516 and the second heat pipe 518, the efficiency of the heat sink 512 is relatively high because the thermal interference among the first chip 504 and the second chip 506 and the third chip 508 is avoided.

Figure 7:
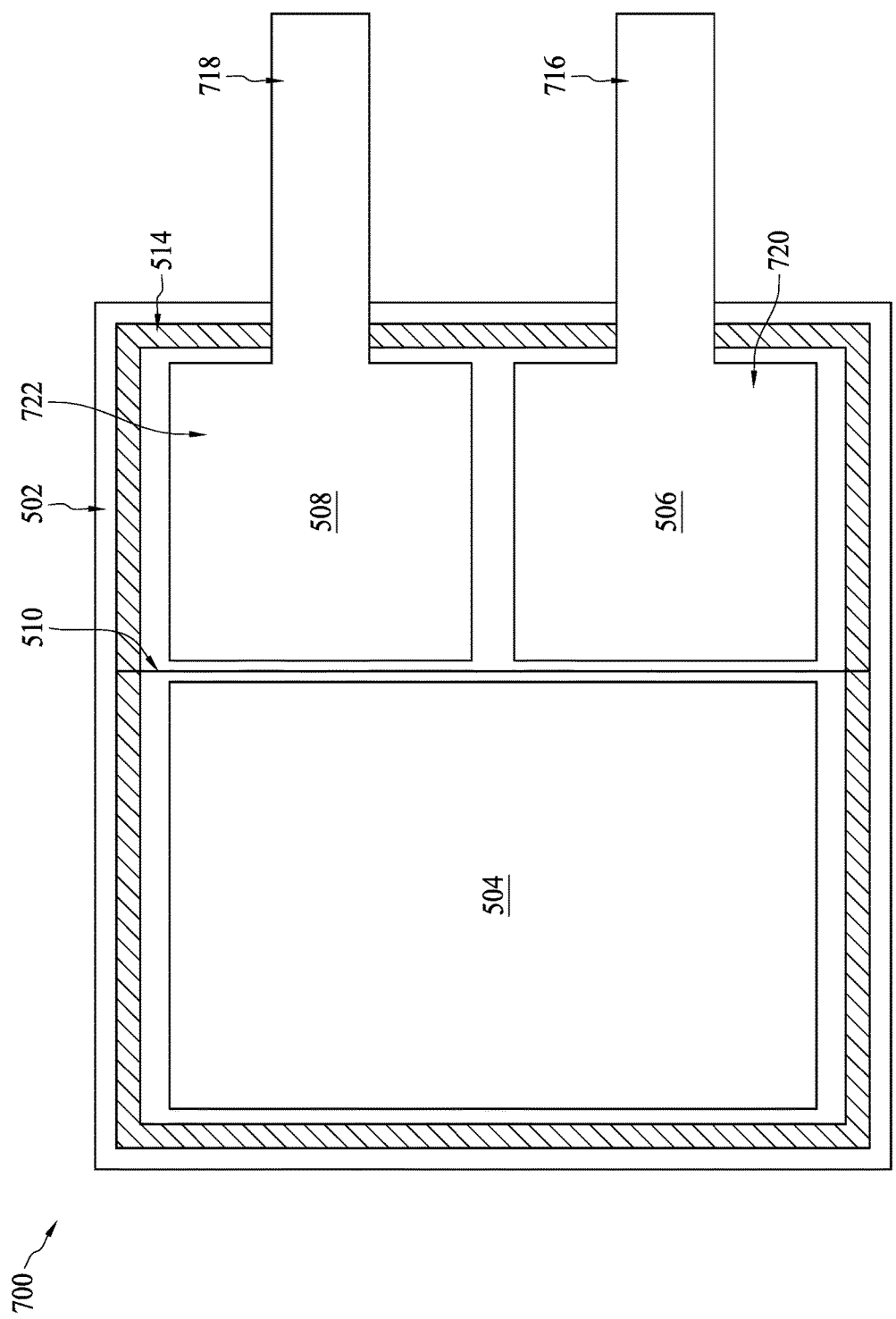
FIG. 7 is a diagram illustrating a top view of a semiconductor packaging device in accordance with some embodiments.

In FIG. 6, the shapes of the first heat pipe 516 and the second heat pipe 518 are substantially rectangle. However, this is not a limitation of the present invention. The first heat pipe 516 and the second heat pipe 518 may be designed to have other shapes. FIG. 7 is a diagram illustrating a top view of a semiconductor packaging device 700 in accordance with some embodiments. For brevity, the heat sink is omitted in FIG. 7. The numerals of the components of the semiconductor packaging device 700 is similar to those in the semiconductor packaging device 500 except for the first heat pipe and the second heat pipe. In comparison to the semiconductor packaging device 500, the first heat pipe 716 and the second heat pipe 718 of the semiconductor packaging device 700 are designed to have a first square portion 720 and a second square portion 722 for contacting the second chip 506 and the third chip 508 respectively. The sizes of the first square portion 720 and the second square portion 722 are substantially equal to the sizes of the second chip 506 and the third chip 508 respectively. When the contact area between the heat pipe and the chip of the semiconductor packaging device 700 is larger than the contact area between the heat pipe and the chip of the semiconductor packaging device 500, the first heat pipe 716 and the second heat pipe 718 have greater heat dissipation capability than the first heat pipe 516 and the second heat pipe 518.

Figure 8:
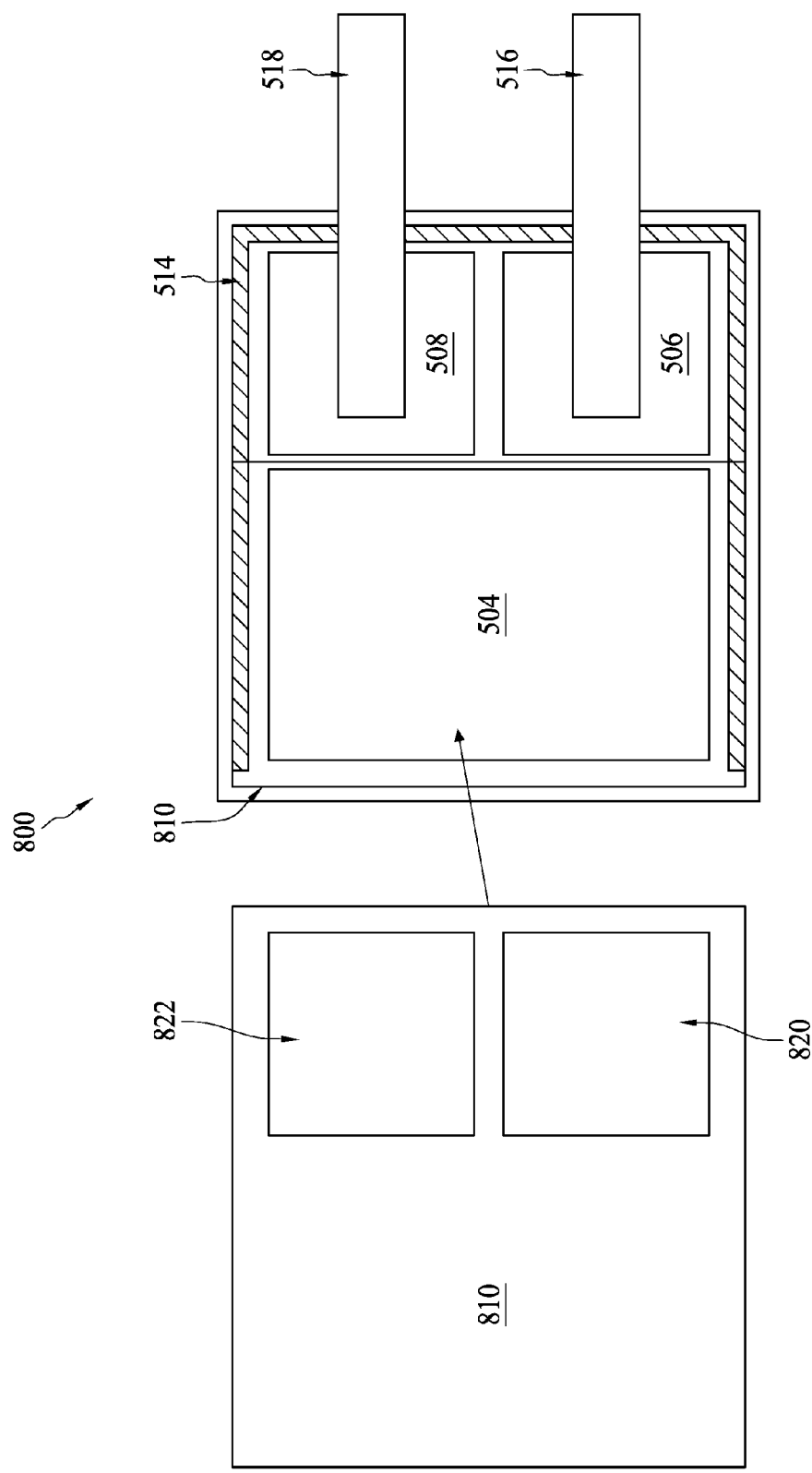
FIG. 8 is a diagram illustrating a top view of a semiconductor packaging device in accordance with some embodiments.

In FIG. 6, the shapes of the lid 510 is substantially rectangle. However, this is not a limitation of the present invention. The lid 510 may be designed to have other shapes. FIG. 8 is a diagram illustrating a top view of a semiconductor packaging device 800 in accordance with some embodiments. For brevity, the heat sink is omitted in FIG. 8. The numerals of the components of the semiconductor packaging device 800 is similar to those in the semiconductor packaging device 500 except for the lid. In comparison to the semiconductor packaging device 500, the lid 810 of the semiconductor packaging device 800 is designed to have a first opening 820 and a second opening 822. For illustration purpose, the lid 810 is replicated on the left side of FIG. 8. The positions of the first opening 820 and the second opening 822 correspond to the second chip 506 and the third chip 508 respectively. When the lid 810 is disposed on the substrate 502, the second chip 506 and the third chip 508 are exposed via the first opening 820 and the second opening 822 respectively. Then, the first heat pipe 516 and the second heat pipe 518 can be disposed on the second chip 506 and the third chip 508 respectively. It is noted that the heights of the second chip 506 and the third chip 508 are greater than the height of the lid 510 so that the first heat pipe 516 and the second heat pipe 518 do not contact to the lid 510.

Figure 9:
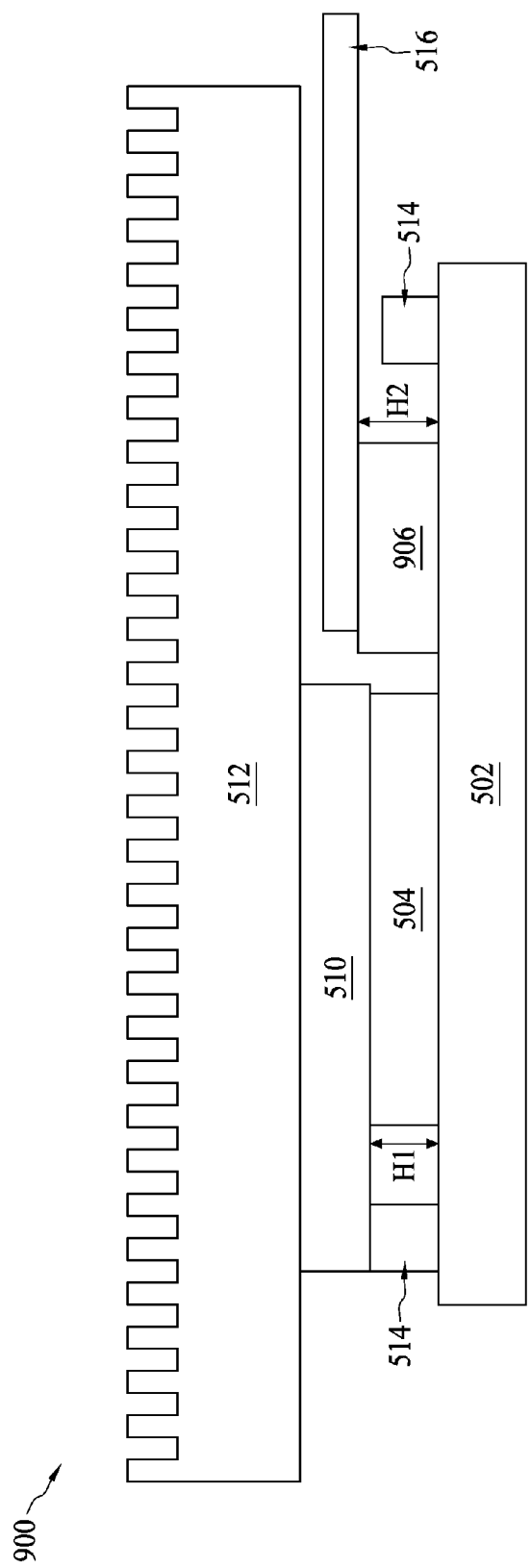
FIG. 9 is a diagram illustrating a cross sectional view of a semiconductor packaging device in accordance with some embodiments.

In FIG. 6, the first chip 504, the second chip 506, and the third chip 508 are designed to have the same height. However, this is not a limitation of the present invention. The first chip 504, the second chip 506, and the third chip 508 may be designed to have different heights. FIG. 9 is a diagram illustrating a cross sectional view of a semiconductor packaging device 900 in accordance with some embodiments. For brevity, the numerals of the components of the semiconductor packaging device 900 is similar to those in the semiconductor packaging device 500 except for the second chip 906. In comparison to the semiconductor packaging device 500, the height H2 of the second chip 906 as well as the third chip (not shown) is greater than the height H1 of the first chip 504. When the second chip 906 is higher than the first chip 504, the first heat pipe 516 as well as the second heat pipe (not shown) may not touch the ring 514. Accordingly, the thermal interference among the first chip 504, the second chip 906, and the third chip (not shown) can be avoided.

Figure 10:
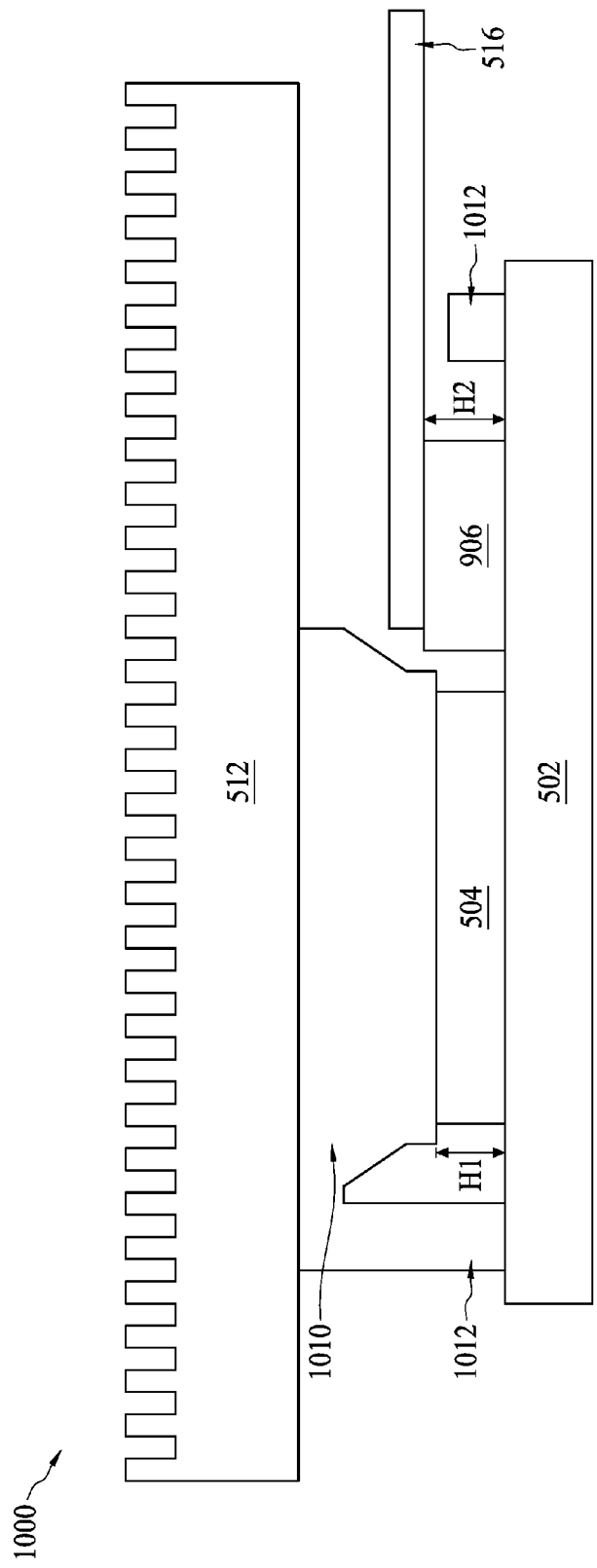
FIG. 10 is a diagram illustrating a cross sectional view of a semiconductor packaging device in accordance with some embodiments.

In FIG. 9, the lid 510 is disposed on the ring 514. However, this is not a limitation of the present invention. The ring 514 may be omitted. FIG. 10 is a diagram illustrating a cross sectional view of a semiconductor packaging device 1000 in accordance with some embodiments. For brevity, the numerals of the components of the semiconductor packaging device 1000 is similar to those in the semiconductor packaging device 900 except for the lid 1010. In comparison to the semiconductor packaging device 900, the lid 1010 is designed to have a supporting frame 1012. The supporting frame 1012 is attached to the substrate 502 for supporting the lid 1010.

Figure 11:
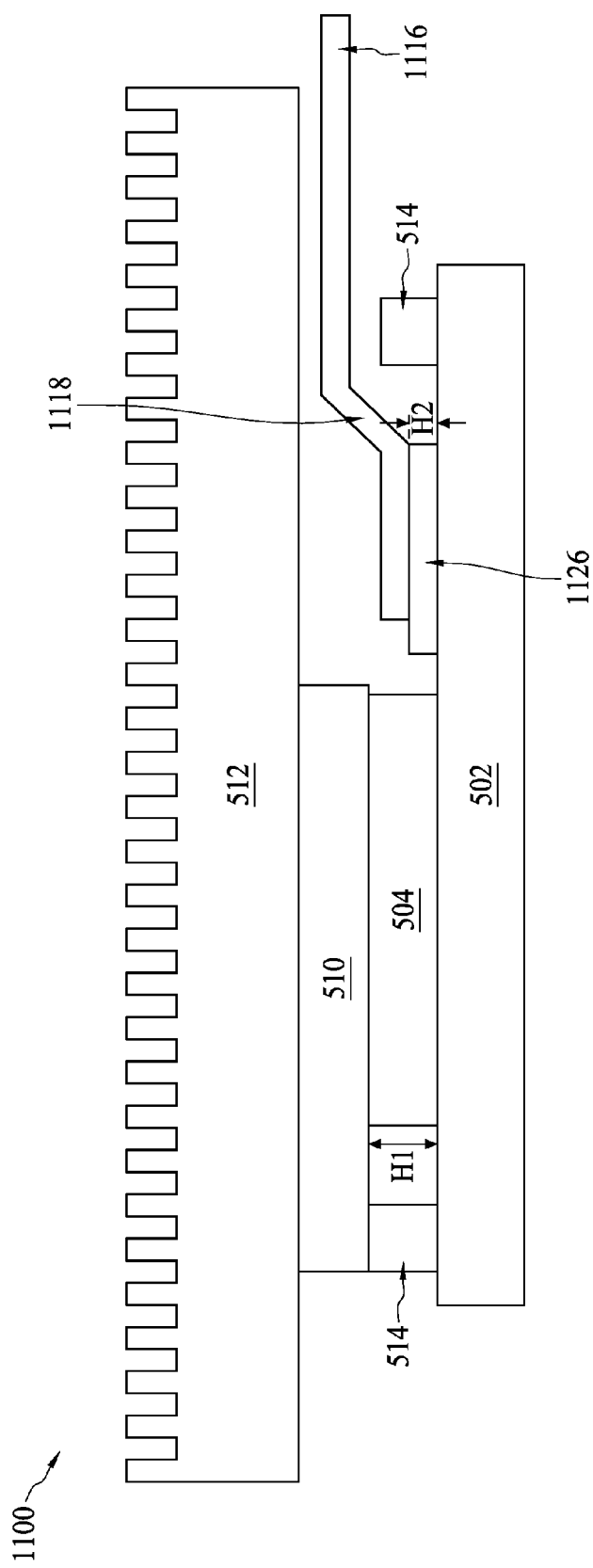
FIG. 11 is a diagram illustrating a cross sectional view of a semiconductor packaging device in accordance with some embodiments.

FIG. 11 is a diagram illustrating a cross sectional view of a semiconductor packaging device 1100 in accordance with some embodiments. For brevity, the numerals of the components of the semiconductor packaging device 1100 is similar to those in the semiconductor packaging device 500 except for the second chip 1126 and the first heat pipe 1116. In comparison to the semiconductor packaging device 500, the height H2 of the second chip 1126 as well as the third chip (not shown) is smaller than the height H1 of the first chip 504. When the second chip 1126 is shorter than the first chip 504, the first heat pipe 1116 as well as the second heat pipe (not shown) is designed to have a bended portion 1118. The bended portion 1118 is arranged to bypass the ring 514 so that the first heat pipe 1116 as well as the second heat pipe (not shown) may not touch the ring 514. Accordingly, the thermal interference among the first chip 504, the second chip 1126, and the third chip (not shown) can be avoided.

Figure 12:
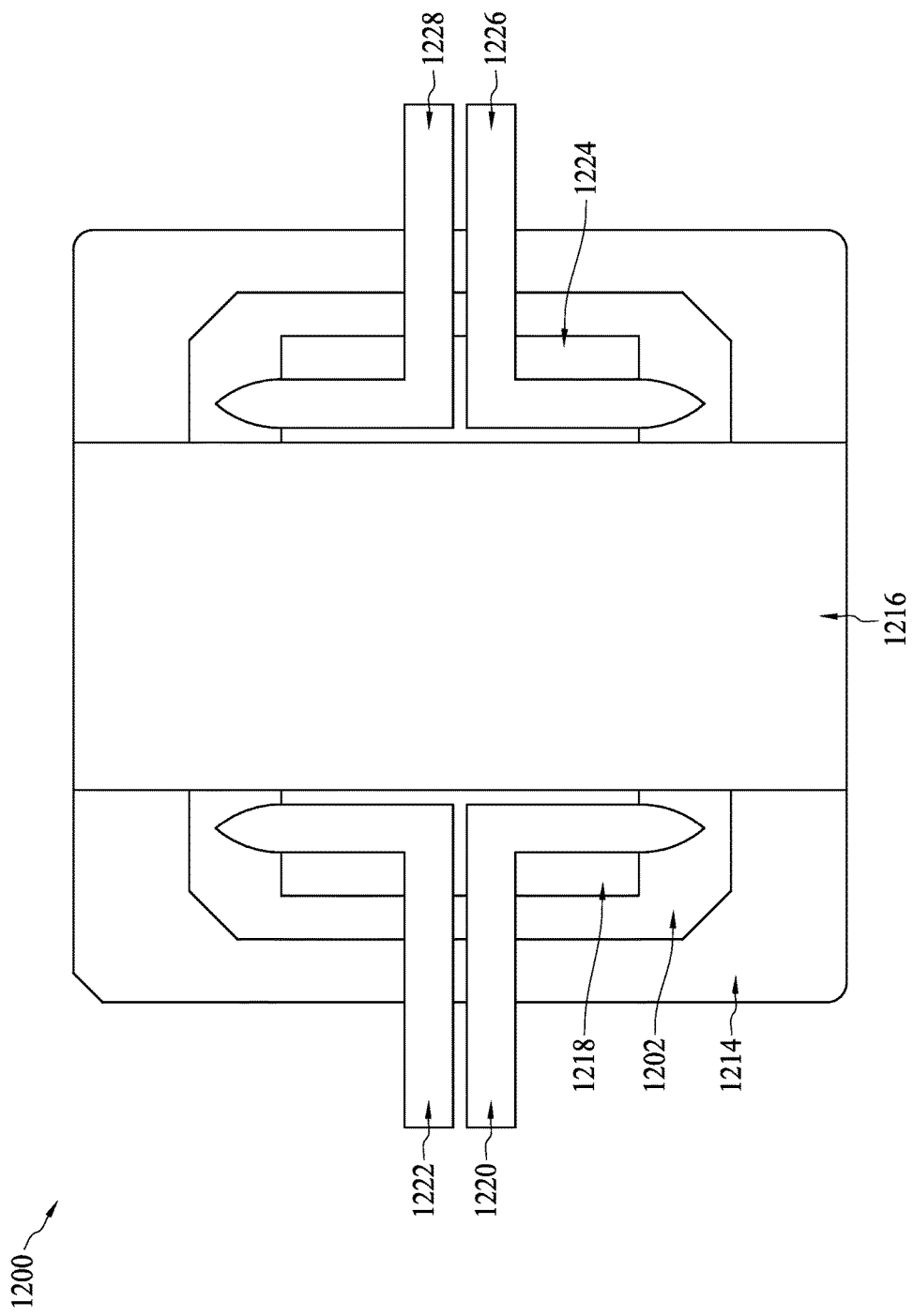
FIG. 12 is a diagram illustrating a top view of a semiconductor packaging device in accordance with some embodiments.
Figure 13:
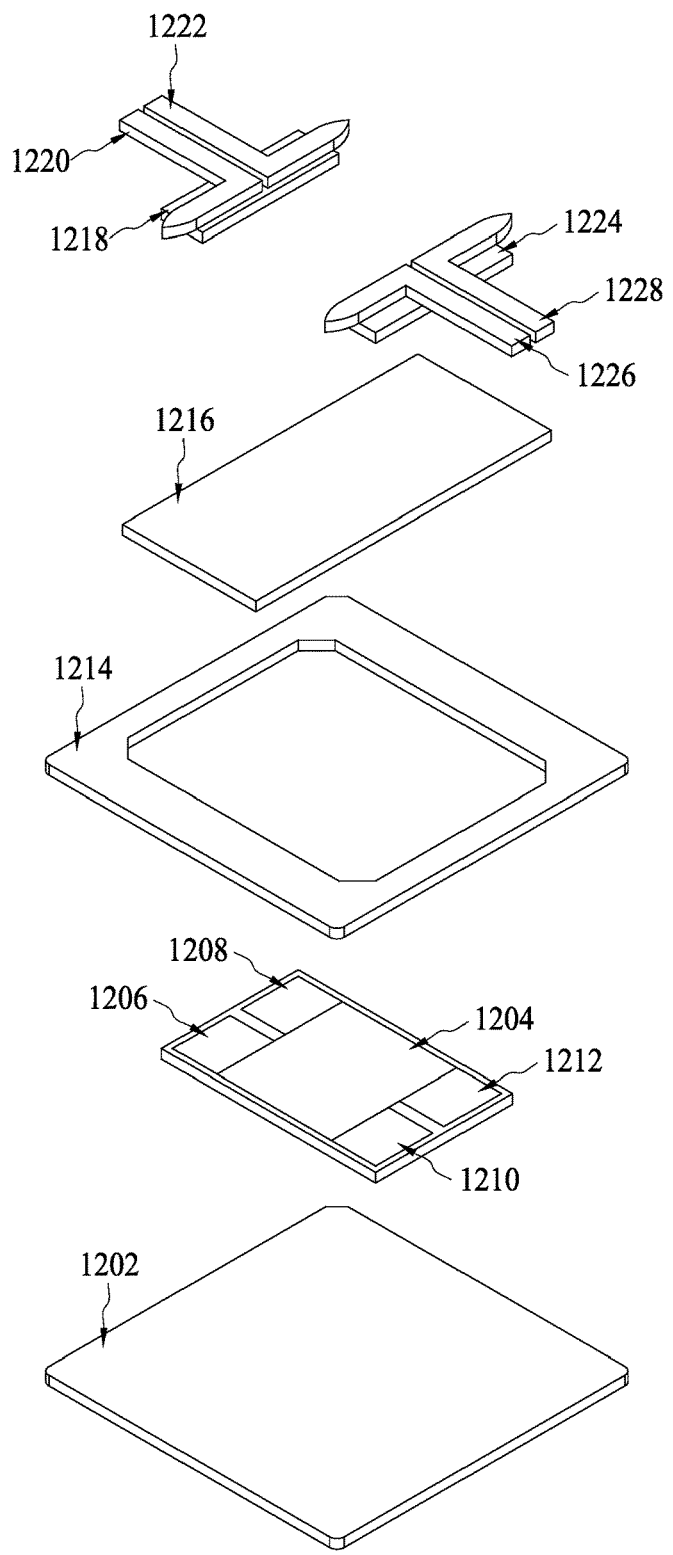
FIG. 13 is a diagram illustrating an exploded view of the semiconductor packaging device of FIG. 12 in accordance with some embodiments.

In FIG. 6, there has two chips, i.e. the second chip 506 and the third chip 508, comprising heat energy producing rating lower than the heat energy producing rating of one chip, i.e. the first chip 504. However, this is not a limitation of the present invention. FIG. 12 is a diagram illustrating a top view of a semiconductor packaging device 1200 in accordance with some embodiments. FIG. 13 is a diagram illustrating an exploded view of the semiconductor packaging device 1200 in accordance with some embodiments. For brevity, the heat sink is omitted in FIG. 12. The semiconductor packaging device 1200 comprises a substrate 1202, a first chip 1204, a second chip 1206, a third chip 1208, a fourth chip 1210, a fifth chip 1212, a ring 1214, a lid 1216, a first copper pad 1218, a first heat pipe 1220, a second heat pipe 1222, a second copper pad 1224, a third heat pipe 1226, and a fourth heat pipe 1228. The first chip 1204, the second chip 1206, the third chip 1208, the fourth chip 1210, and the fifth chip 1212 are disposed on the substrate 1202, in which the first chip 1204 is disposed in the middle of the substrate 1202, the second chip 1206 the third chip 1208 are disposed on one side of the substrate 1202, and the fourth chip 1210 and the fifth chip 1212 are disposed on the other side of the substrate 1202. The ring 1214 is arranged to surround the first chip 1204, the second chip 1206, the third chip 1208, the fourth chip 1210, and the fifth chip 1212. The lid 1216 is disposed on the first chip 1204. The heat sink (not shown) is disposed on the lid 1216. The heat sink (not shown) comprises a heat energy dissipation rating for dissipating heat energy generated by the first chip 1504. The first copper pad 1218 is disposed on the second chip 1206 and the third chip 1208. The second copper pad 1224 are disposed on the fourth chip 1210 and the fifth chip 1212. The first heat pipe 1220 and the second heat pipe 1222 are disposed on the second chip 1206 and the third chip 1208, respectively, via the first copper pad 1218. The third heat pipe 1226 and the fourth heat pipe 1228 are disposed on the fourth chip 1210 and the fifth chip 1212, respectively, via the second copper pad 1224. The first heat pipe 1220, the second heat pipe 1222, the third heat pipe 1226, and the fourth heat pipe 1228 comprise a first, second, third, and fourth heat energy dissipation ratings for dissipating heat energy generated by the second chip 1206, the third chip 1208, the fourth chip 1210, and the fifth chip 1212 respectively. The first heat pipe 1220, the second heat pipe 1222, the third heat pipe 1226, the fourth heat pipe 1228, and the heat sink (not shown) are physically separated from each other.

According to the semiconductor packaging device 1200, the heat energy producing rating produced by the second chip 1206, the third chip 1208, the fourth chip 1210, and the fifth chip 1212 is lower than the heat energy producing rating of the first chip 1204. Therefore, the heat energy of the second chip 1206, the third chip 1208, the fourth chip 1210, and the fifth chip 1212 can be dissipated by the first heat pipe 1220, the second heat pipe 1222, the third heat pipe 1226, and the fourth heat pipe 1228 respectively. The heat energy of the first chip 1204 is dissipated by the heat sink (not shown) alone. Thus, the efficiency of the heat sink is relatively high because the thermal interference among the first chip 1204, the second chip 1206, the third chip 1208, the fourth chip 1210, and the fifth chip 1212 is avoided.

Figure 14:
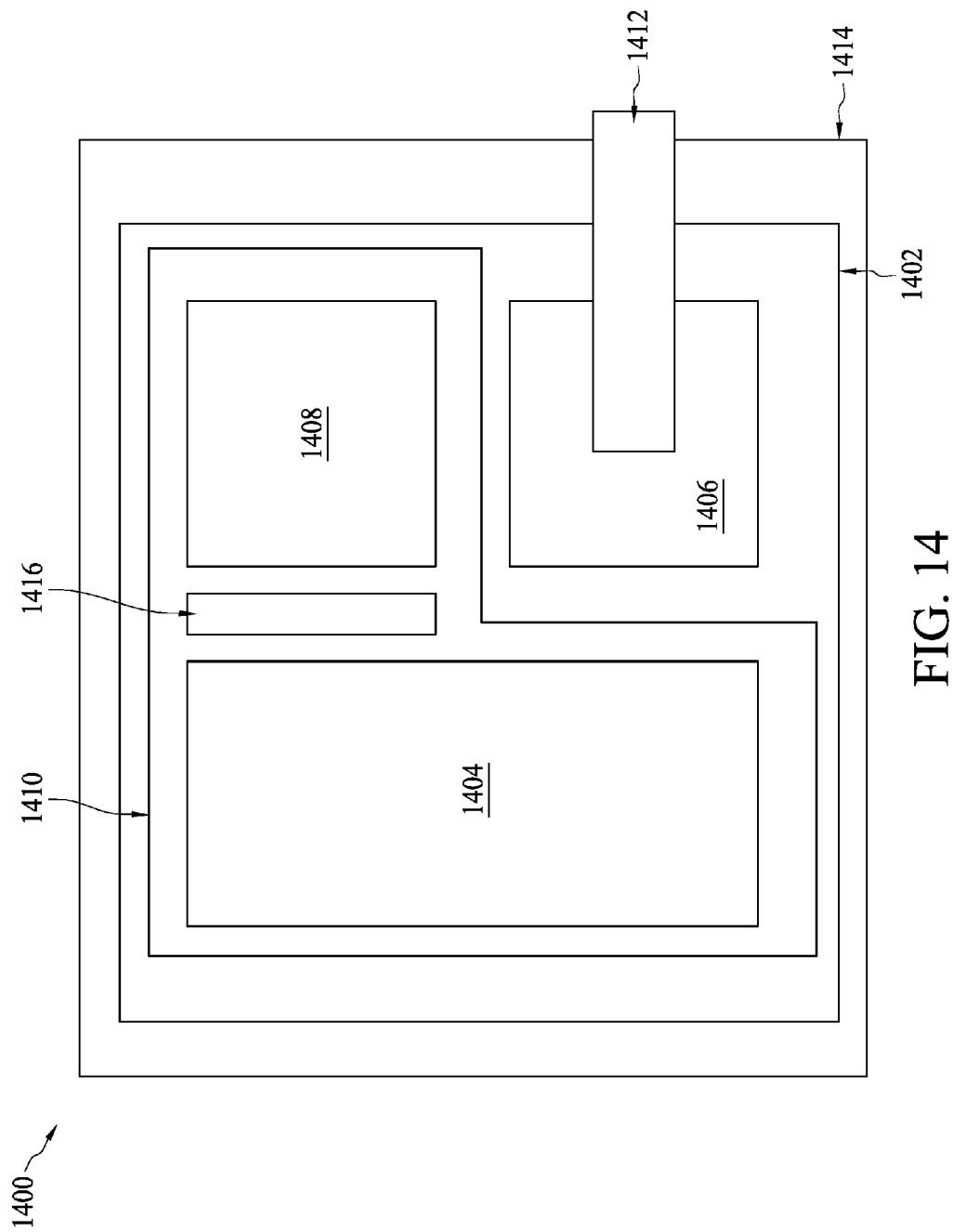
FIG. 14 is a diagram illustrating a top view of a semiconductor packaging device in accordance with some embodiments.

In FIG. 1, the lid 110 and the heat sink 112 are designed to have the slots 1102 and 1122 for isolating the heat energy from transferring to the second chip 106 and the third chip 108 from the first chip 104. However, this is not a limitation of the present invention. FIG. 14 is a diagram illustrating a top view of a semiconductor packaging device 1400 in accordance with some embodiments. For brevity, the heat sink is omitted in FIG. 14. The semiconductor packaging device 1400 comprises a substrate 1402, a first chip 1404, a second chip 1406, a third chip 1408, a lid 1410, a heat pipe 1412, and a heat sink 1414. The first chip 1404, the second chip 1406, and the third chip 1408 comprise a first heat energy producing rating, a second heat energy producing rating, and a third heat energy producing rating respectively during a normal operation, and the first heat energy producing rating is greater than the second heat energy producing rating and the third heat energy producing rating. In addition, the first chip 1404, the second chip 1406, and the third chip 1408 have a first height, a second height, and a third height respectively, and the third height may be different from the first height and the second height. The lid 1410 as well as the heat sink 1414, which is disposed on the lid 1410, is arranged to have a slot 1416 on an interspace between the first chip 1404 and the third chip 1408. The slot 1416 is arranged to isolate or limit the heat transfer between to the third chip 1408 and the first chip 1404. The heat pipe 1412 is disposed or directly attached on the second chip 1406. The heat pipe 1412 comprises a heat energy dissipation rating corresponding to the second heat energy producing rating for dissipating the heat energy generated by the second chip 1406. The heat pipe 1412 is physically separated from the lid 1410 and the heat sink 1414. Accordingly, the thermal interference among the first chip 1404, the second chip 1406, and the third chip 1408 can be avoided. It is noted that the feature of the slot 1416 and the heat pipe 1412 has been described in the above embodiments, the detailed description is omitted here for brevity.

Briefly, in some embodiments, the present semiconductor packaging device is arranged to dissipate heat energy of the chips by using a heat sink having a slot, in which the slot is adaptively designed to isolate the heat transfer between two chips producing different heat energy producing ratings. Moreover, the present semiconductor packaging device is further arranged to use a heat pipe to dissipate heat energy of a chip having relatively low heat energy producing rating. The heat pipe is physically separated from the heat sink. Therefore, the heat sink and the heat pipe are capable of alleviating thermal interference between or among the chips. As the heat sink and the heat pipe are compatible with the existing thermal solution supply chain, the cost of the present multi-chip package is relatively low.

Some embodiments of the present disclosure provide a semiconductor packaging device. The semiconductor packaging device comprises a first chip, a second chip, and a heat sink. The first chip is disposed separately from the first chip on a substrate. The second chip is disposed on the substrate, wherein the first chip and the second chip comprise a first heat energy producing rating and a second heat energy producing rating, respectively, the first heat energy producing rating is different from the second heat energy producing rating. The heat sink arranged in thermal communication with the first chip and the second chip, wherein the heat sink is arranged to have a first slot configured substantially along a separation region between the first chip and the second chip.

Some embodiments of the present disclosure provide a semiconductor packaging device. The semiconductor packaging device comprises a first chip, a second chip, a heat sink, and a heat pipe. The first chip is disposed on a substrate. The second chip is disposed separately from the first chip on the substrate. The heat sink is disposed in thermal communication with the first chip and arranged at least partially over the second chip, the heat sink comprises a first heat energy dissipation rating corresponding to a heat energy producing rating of the first chip. The heat pipe is disposed on the second chip and at least partially under a planar projection of the heat sink, the heat pipe comprises a second heat energy dissipation rating corresponding to a second heat energy producing rating of the second chip; wherein the heat pipe has a first end directly attached to the second chip and a second end extended beyond the heat sink, and the first heat energy producing rating is different from the second heat energy producing rating.

Some embodiments of the present disclosure provide a semiconductor packaging device. The semiconductor packaging device comprises a first chip, a second chip, and a heat sink. The second chip is disposed separately form the first chip. The heat sink is arranged in thermal communication with the first chip and the second chip, wherein the heat sink is arranged to have a first slot for limiting heat transfer between the first chip and the second chip via the heat sink.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor packaging device, comprising:
   a first chip, disposed on a substrate;
   a second chip, disposed separately from the first chip on the substrate, wherein the first chip and the second chip comprise a first heat energy producing rating and a second heat energy producing rating, respectively, the first heat energy producing rating is different from the second heat energy producing rating;
   a heat sink arranged in thermal communication with the first chip and the second chip, wherein the heat sink is arranged to have a first slot configured substantially along a separation region between the first chip and the second chip; and
   a lid, disposed on the first chip and the second chip;

wherein the heat sink is disposed on the lid, and the lid is arranged to have a second slot substantially aligned with the first slot.

2. The semiconductor packaging device of claim 1, wherein the heat sink is a one-piece device.

3. The semiconductor packaging device of claim 1, wherein the first slot is arranged to penetrate from a top surface of the heat sink to a bottom surface of the heat sink.

4. The semiconductor packaging device of claim 1, wherein the second chip is physically separated from the first chip by an interspace, and the first slot substantially aligns with the interspace.

5. The semiconductor packaging device of claim 4, wherein the first slot is arranged to expose a portion of the substrate corresponding to the interspace to an external environment.

6. The semiconductor packaging device of claim 1, wherein the second chip is physically separated from the first chip by a polymer layer, and the first slot substantially aligns with the polymer layer.

7. The semiconductor packaging device of claim 6, wherein the first slot is arranged to expose the polymer layer to an external environment.

8. The semiconductor packaging device of claim 1, wherein the second slot is arranged to penetrate from a top surface of the lid to a bottom surface of the lid.

9. The semiconductor packaging device of claim 1, further comprising:
- a third chip, disposed on the substrate, comprising a third heat energy producing rating; and
- a heat pipe, disposed on the third chip, comprising a heat energy dissipation rating corresponding to the third heat energy producing rating.

10. The semiconductor packaging device of claim 9, wherein the heat pipe is physically separated from the heat sink.

11. The semiconductor packaging device of claim 9, wherein the third heat energy is smaller than the first heat energy and/or the second heat energy.

12. The semiconductor packaging device of claim 9, wherein the first chip, the second chip, and the third chip have a first height, a second height, and a third height respectively, and the third height is different from the first height and the second height.

13. A semiconductor packaging device, comprising:
- a first chip, disposed on a substrate;
- a second chip, disposed separately from the first chip on the substrate; and
- a heat sink, disposed in thermal communication with the first chip and arranged at least partially over the second chip, the heat sink comprising a first heat energy dissipation rating corresponding to a first heat energy producing rating of the first chip; and
- a heat pipe, disposed on the second chip and at least partially under a planar projection of the heat sink, the heat pipe comprising a second heat energy dissipation rating corresponding to a second heat energy producing rating of the second chip;
- wherein the heat pipe has a first end directly attached to the second chip and a second end extended beyond the heat sink, and the first heat energy producing rating is different from the second heat energy producing rating.

14. The semiconductor packaging device of claim 13, wherein the heat pipe is physically separated from the heat sink.

15. The semiconductor packaging device of claim 13, wherein the first heat energy dissipating rating is greater than the second heat energy dissipating rating.

16. The semiconductor packaging device of claim 13, wherein the first chip and the second chip have a first height and a second height respectively, and the second height is different from the first height.

17. A semiconductor packaging device, comprising:
- a first chip;
- a second chip, disposed separately from the first chip;
- a lid, disposed on the first chip and the second chip; and
- a heat sink arranged in thermal communication with the first chip and the second chip, wherein the heat sink is arranged to have a first slot for limiting heat transfer between the first chip and the second chip via the heat sink, the heat sink is disposed on the lid, and the lid is arranged to have a second slot substantially aligned with the first slot.

18. The semiconductor packaging device of claim 17, wherein the second chip is physically separated from the first chip by an interspace, and the interspace is disposed with a polymer layer.

* * * * *